United States Patent
Utsumi et al.

(10) Patent No.: US 6,215,077 B1
(45) Date of Patent: Apr. 10, 2001

(54) THIN-FILM LAMINATE TYPE CONDUCTOR (75) Inventors: Makoto Utsumi; Yutaka Terao, both of Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/050,147

(22) Filed: Mar. 30, 1998

(30) Foreign Application Priority Data

Mar. 28, 1997 (JP) .................................................... 9-092828

(51) Int. Cl.[7] ...................................................... H05K 1/00
(52) U.S. Cl. .......................... 174/268; 174/255; 174/256; 361/779; 257/920; 257/927
(58) Field of Search ..................... 174/255, 256, 174/257, 258, 359 C, 268; 428/209, 210, 432, 433, 469, 623, 632, 633, 630; 361/779; 257/920, 927, 749, 750

(56) References Cited

U.S. PATENT DOCUMENTS

| | | | |
|---|---|---|---|
| 4,770,947 | * 9/1988 | Flagello et al. | 428/630 |
| 4,835,061 | * 5/1989 | Ohta et al. | 428/469 |
| 4,859,532 | * 8/1989 | Oyama et al. | 428/336 |
| 5,187,604 | 2/1993 | Taniguchi et al. | 359/88 |
| 5,395,698 | * 3/1995 | Neuman et al. | 428/428 |
| 5,514,454 | * 5/1996 | Boire et al. | 428/216 |
| 5,591,529 | * 1/1997 | Braatz et al. | 428/457 |
| 5,718,980 | * 2/1998 | Koch et al. | 428/428 |
| 5,880,406 | * 3/1999 | Gerstel et al. | 174/256 |
| 5,891,556 | * 4/1999 | Anderson et al. | 428/216 |

FOREIGN PATENT DOCUMENTS

| | | | |
|---|---|---|---|
| 4-19781 | 1/1992 | (JP) . | |
| 5-307997 | 11/1993 | (JP) . | |
| 8903306 | * 4/1989 | (WO) | 428/630 |

* cited by examiner

Primary Examiner—Dean A. Reichard
Assistant Examiner—Dhiru R. Patel
(74) Attorney, Agent, or Firm—Rossi & Associates (57) ABSTRACT

A thin-film laminate type conductor is provided which includes a first conductor that is a metal thin film formed of Al or Al alloy, and a second conductor that is a transparent conductive thin film formed of a metal oxide. The first and second conductors are formed in respective patterns on a transparent substrate, such that at least a part of the second conductor is laminated on at least a part of the first conductor. The transparent conductive thin film is composed of an amorphous film. In another embodiment, the first conductor is composed of laminated metal thin films one of which is formed of Al or Al alloy, and the other of which is formed of a high-melting-point metal. The Al or Al-alloy film is sandwiched between the substrate and the high-melting-point metal film.

9 Claims, 4 Drawing Sheets

THIN-FILM LAMINATE TYPE CONDUCTOR

FIELD OF THE INVENTION

The present invention relates to thin-film laminate type conductors each consisting of a metal thin film and a transparent conductive thin film, which are used in flat display panels, such as electroluminescent displays or liquid crystal displays.

BACKGROUND OF THE INVENTION

In the field of liquid crystal displays or electroluminescent (EL) displays, transparent conductive thin films typically formed of indium tin oxide (ITO) are patterned in certain shapes, and widely used as pixel electrodes and wires (which will be generally called "conductors"). Such a transparent conductive thin film, however, has a relatively high resistivity, which undesirably results in increased resistance in the wiring system. In order to reduce the resistance in the wiring using the transparent conductive thin film, it has been proposed to employ a laminated structure consisting of a transparent conductive thin film and a metal thin film (as disclosed in Japanese laid-open Patent Publications No. 5-307997 and No. 6-7180) in display devices that tend to be large-sized in recent years.

One type of the laminated structure is formed by laminating a metal semi-transparent film having a thickness of 20 nm or smaller and a transparent conductive thin film over the entire area of an electrode surface. This laminated structure, however, cannot be practically used since it has an insufficient light transmittance in its portion where pixels are present, and the resistance in the wiring system as a whole cannot be sufficiently reduced.

To solve the above problem, a laminate type conductor is employed wherein a metal thin film having a thickness of about 50 nm or larger is superposed on a portion of a transparent conductive thin film other than its portion that forms a matrix of pixels. The metal thin film is often formed of Al or an alloy containing Al as a major component, so as to achieve sufficiently reduced resistance. Such a laminate type conductor may be classified into two types which are different in the laminated structure of the transparent conductive thin film and metal thin film (or different in the order in which the films are formed). One of the two types is produced by forming the transparent conductive thin film on a substrate, patterning the thin film, and then forming and patterning the metal thin film. The other type is produced by forming and patterning the metal thin film on the substrate, and then forming and patterning the transparent conductive thin film.

The former type of laminated structure is disadvantageous in that the choice of a metal for forming the metal thin film is limited since an etching liquid used when patterning the metal thin film should not dissolve the transparent conductive thin film. In the case where the metal thin film is patterned by dry etching, too, the surface of the transparent conductive thin film may be etched and thus damaged.

Figure 9:
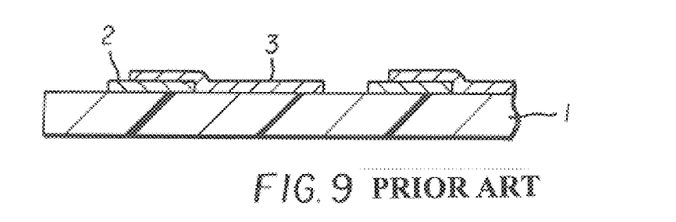
FIG. 9 is a schematic cross-sectional view showing a known example of thin-film laminate type conductor.

The latter type of laminated structure is illustrated in FIG. 9. FIG. 9 is a schematic cross-sectional view showing a known example of thin-film laminate type conductor. A metal thin film 2 made of Al and a crystalline, transparent conductive thin film 3 made of ITO are formed in respective patterns on a substrate 1, such that a part of the conductive thin film 3 is laminated on a part of the metal thin film 2. This structure is disadvantageous in that projections called "hillocks" are formed on the metal thin film under the ITO thin film when the substrate is heated to 150° C.–350° C. during formation and heat treatment of the ITO thin film. The hillocks are reflected by the ITO thin film laminated on the metal thin film, and even larger hillocks are formed on the surface of the ITO thin film. The hillocks thus formed may cause abnormalities, such as short-circuiting with opposed electrodes, which considerably deteriorate the reliability of the display device.

Figure 10:
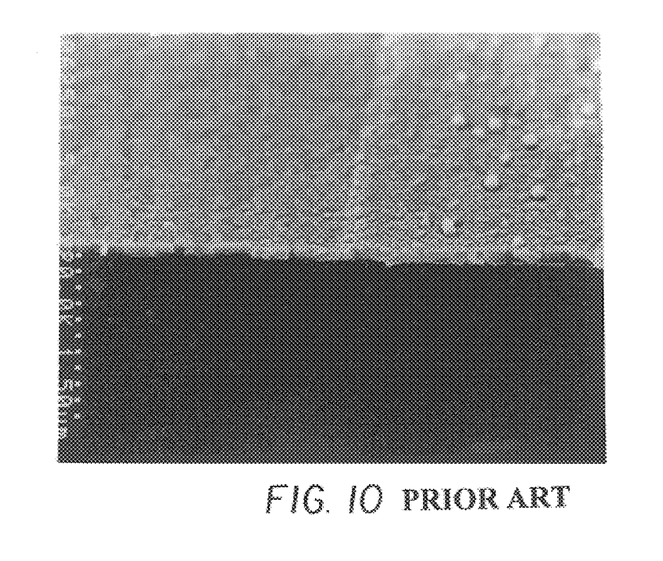
FIG. 10 is a SEM photograph showing the prior art.

FIG. 10 is a SEM (scanning electron microscope) photograph showing hillocks that appear in a laminated portion of known transparent conductive thin film (ITO thin film) and metal thin film. The substrate temperature during formation of the ITO thin film is 300° C., and the thickness of the Al film is 50 nm. In the photograph, hillocks are represented by white granular substances that appear in the laminated portion (on the right-hand side of the boundary that extends obliquely in the vertical direction).

The hillocks may be produced for the following reason. There is a large difference in the coefficient of thermal expansion between the substrate and the Al alloy forming the metal thin film, and strains tend to arise inside the Al-alloy film having the larger coefficient of thermal expansion when the substrate and Al-alloy thin film are heated during formation of the ITO film. The hillocks protrude from the surface of the Al-alloy film so as to reduce the strains. To avoid these hillocks, a metallic material for the metal thin film laminated with the transparent conductive thin film has been selected from high-melting-point metals, such as Ta, Ti, Mo, and Cr, which have a relatively low coefficient of thermal expansion. The high-melting-point metals, however, have high resistivity, and the use of such metals undesirably results in an increase in the power consumption in display devices.

In order to reduce power consumed by display devices, it has been reconsidered to use Al-containing alloys having low resistivity for the metal thin film so as to prevent occurrence of hillocks (as proposed in Japanese laid-open Patent Publications No. 5-100248 and No. 8-37186, N. Peacock, Thin Solid Films vol 156 (1988), 173). In the laminate type conductor, however, no attempt has been made to prevent occurrence of hillocks by means of the material of the transparent conductive thin film or method for forming this film, or a new electrode structure.

SUMMARY OF THE INVENTION

It is therefore an object of the present invention to provide a laminate type conductor consisting of a metal thin film formed of an Al alloy and a transparent conductive thin film, which conductor is free from hillocks and provide low resistance.

To accomplish the above object, there is provided a thin-film laminate type conductor, comprising: a first conductor which is a metal thin film comprising one of Al and an Al alloy, the first conductor being formed in a pattern on a transparent substrate, and a second conductor which is a transparent conductive thin film comprising a metal oxide, the second conductor being formed in a pattern on the substrate, such that at least a part of the second conductor is laminated on at least a part of the first conductor, wherein the transparent conductive thin film is amorphous.

Preferably, the Al alloy of the metal thin film is selected from Al alloys containing at least one of Si, Cu, Ti, Ta, Mo, Cr, Ni, Y, La, Nd, Gd, Tb and Dy.

According to another aspect of the present invention, there is provided a thin-film laminate type conductor, comprising a first conductor which is a metal thin film formed in a pattern on a transparent substrate; and a second conductor which is a transparent conductive thin film comprising a metal oxide, the second conductor being formed in a pattern on the substrate, such that at least a part of the second conductor is laminated on at least a part of the first conductor, wherein the first conductor comprises a first metal thin film made of one of Al and an Al alloy, and a second metal thin film made of a high-melting-point metal, the second metal thin film being laminated on the first metal thin film formed on the substrate. In this case, the transparent conductive thin film may be a crystalline film.

Preferably, the Al alloy of the first metal thin film of the first conductor is selected from Al alloys containing at least one of Si, Cu, Ti, Ta, Mo, Cr, Ni, Y, La, Nd, Gd, Th and Dy.

Preferably, the metal oxide for forming the second conductor is indium tin oxide or indium zinc oxide.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Figure 1:
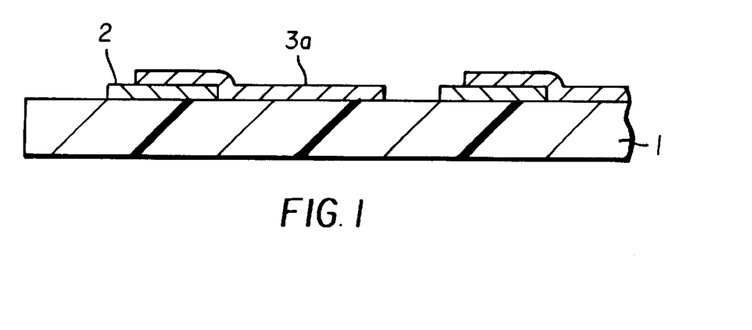
FIG. 1 is a schematic cross-sectional view showing a thin-film laminate type conductor of the present invention having an amorphous transparent conductive thin film.

FIG. 1 is a schematic cross-sectional view showing a thin-film laminate type conductor as one embodiment of the present invention, which has an amorphous transparent conductive thin film. A first conductor 2 that is a metal thin film, and a second conductor 3a that is an amorphous transparent conductive thin film are formed in respective patterns on a substrate 1, such that a part of the second conductor 3a is laminated on a part of the first conductor 2.

When the amorphous transparent conductor thin film 3a is formed, the substrate 1 needs to be kept at a temperature that is lower than the temperature at which the transparent conductive material is crystallized. Accordingly, thermal influences on the first conductor 2 are eliminated, and hillocks are prevented from being formed on the first and second conductors 2, 3a.

In the case of a crystalline transparent conductive thin film, unevenness (protrusions and recesses) of the surface of this thin film is increased as the thickness of the film is increased, thereby causing defects, such as electric short circuiting. It was therefore impossible to increase the thickness of the crystalline transparent conductive thin film used in an organic EL device, for example. The amorphous transparent conductive thin film of the present invention, on the other hand, is formed at a relatively low temperature, with its surface being made flat as compared with that of the crystalline transparent conductive thin film. Thus, the amorphous transparent conductive thin film can be formed with an increased thickness, assuring improved conductivity.

Figure 2:
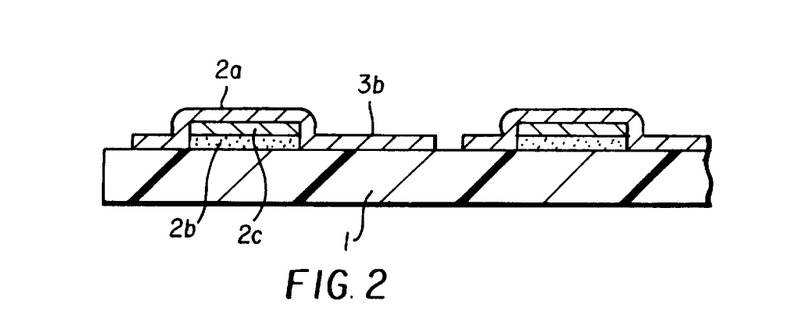
FIG. 2 is a schematic cross-sectional view showing a thin-film laminate type conductor of the present invention having a first conductor consisting of laminated metal thin films.

FIG. 2 is a schematic cross-sectional view showing a thin-film laminate type conductor as another embodiment of the present embodiment, wherein the first conductor is covered with a high-melting-point metal thin film. A first metal thin film 2b made of Al or Al alloy, which is formed on a substrate 1, is covered with a second metal thin film 2c made of a metal having a high melting point, and the thin films thus laminated are patterned to provide a first conductor 2a. A second conductor to 3b that is a patterned transparent conductive thin film is formed on at least a part of the laminated films 2b, 2c (first conductor 2a). In the example shown in FIG. 2, the second conductor 3b covers the entire surface area of the first conductor 2a.

In the present embodiment, the first metal thin film 2b made of Al or Al alloy is sandwiched between the substrate 1 having a smaller coefficient of thermal expansion than Al alloy, and the second metal thin film 2c made of a high-melting-point metal and having a smaller coefficient of thermal expansion than Al alloy. This laminated structure is able to restrict or reduce thermal expansion of the first conductor 2a due to heat applied to the substrate when the transparent conductive thin film 3b is formed, thereby to prevent occurrence of hillocks.

In this embodiment, since the substrate 1 can be heated to a sufficiently high temperature when the transparent conductive film 3b is formed, the crystalline transparent conductive film thus formed has a high transmittance with respect to visible light, and a small resistivity.

The substrate used in the present invention may be a glass substrate, or a film-like substrate, such as a polymer film, or an organic film, such as a color filter, that is formed on a glass substrate.

The Al alloy as indicated above may be selected from Al—Si alloy, Al—Cu alloy, Al—Ta alloy, Al—Ti alloy, Al—Mo alloy, Al—Y alloy, and Al—Nd alloy as used in Examples below, and also selected from alloys of Al and a high-melting-point metal, including Al—Ni alloy and Al—Cr alloy, and alloys of Al and a rare earth element, including Al—Gd alloy and Al—Dy alloy.

The transparent conductive thin film may be formed of ITO (indium tin oxide) or indium zinc oxide, as in Examples that will be described later.

Some examples of the present invention will be next described.

In Example 1 and Example 2, thin-film laminate type conductors having amorphous transparent conductive thin films were produced according to the present invention.

EXAMPLE 1

Initially, an Al film having a thickness of 100 nm was formed by DC sputtering on a glass substrate (NA-45 manufactured by HOYA Corporation, Japan), to provide a metal thin film, In a similar manner, Al-alloy films made of Al-2 at % Cu, Al-1 at % Ta, Al-1 at % Ti, Al-1 at % Mo, Al-2 at % Y, and Al-2 at % Nd were respectively formed on different substrates, to provide additional metal thin films. Each of the thus formed metal thin films was patterned in a certain shape, to provide the first conductor (as shown in FIG. 1).

On each of the above metal thin films, a transparent conductive thin film having a thickness of 150 nm was formed by reactive DC sputtering, using $In_2O_3$-10 wt % $SnO_2$ target, without heating the substrate, and patterned in a certain shape, to provide the second conductor (as shown in FIG. 1).

Figure 3:
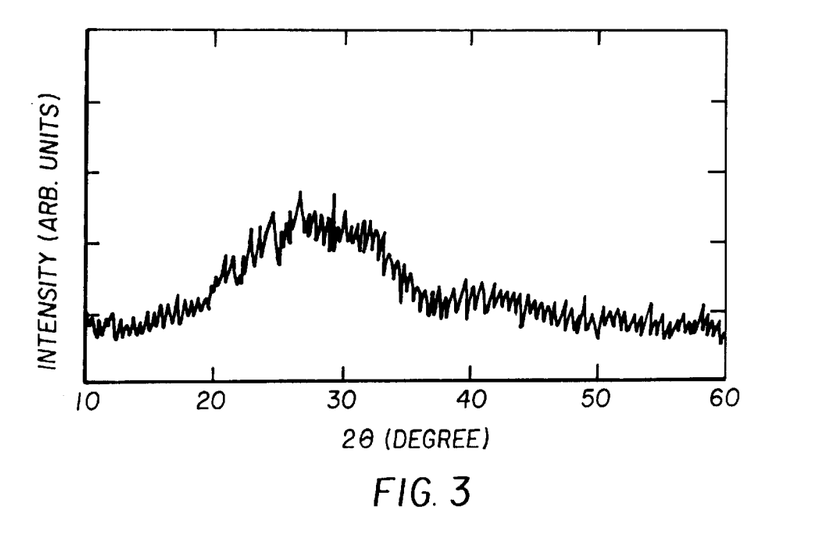
FIG. 3 is a graph showing an X ray diffraction spectrum of a transparent conductive thin film of Example 1 of the present invention.

FIG. 3 is a graph showing an X-ray diffraction spectrum of the transparent conductive thin film according to the present invention. The X-ray diffraction spectrum indicates a wide peak, which confirms that the obtained transparent conductive thin film is a mono-phase amorphous film.

Figure 4:
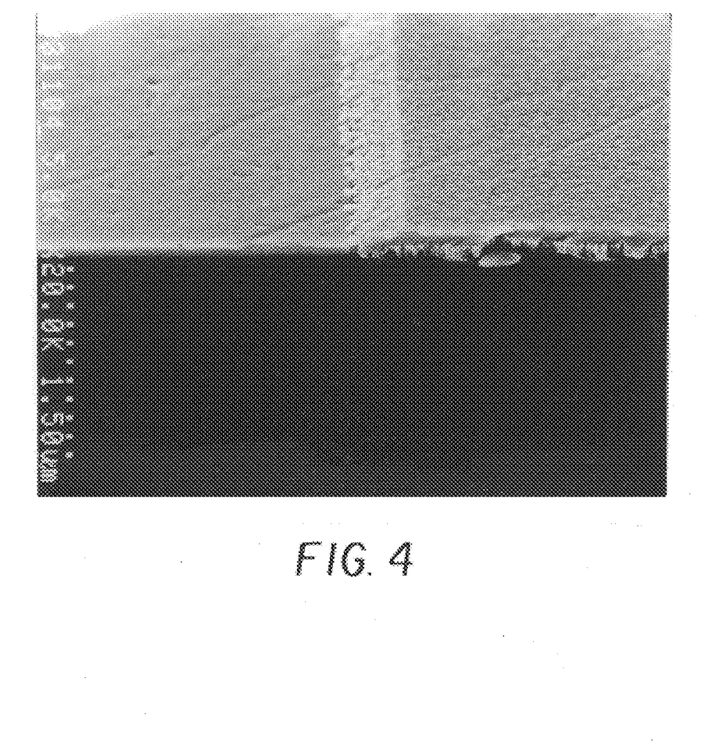
FIG. 4 is a SEM photograph showing the surface condition of a first conductor in the form of an Al film and a second conductor in the form of an amorphous ITO film.

FIG. 4 is a SEM (scanning electron microscope) photograph showing the surface condition of the first conductor made of Al and the amorphous second conductor made of ITO. It will be understood from FIG. 4 that hillocks do not appear in the laminated portion (on the right-hand side of the vertical boundary) of the first conductor and second conductor, namely, the laminated portion provides a flat surface. Similarly, hillocks were not observed in the other cases where the first conductors were formed of the above-indicated Al alloys.

Figure 5:
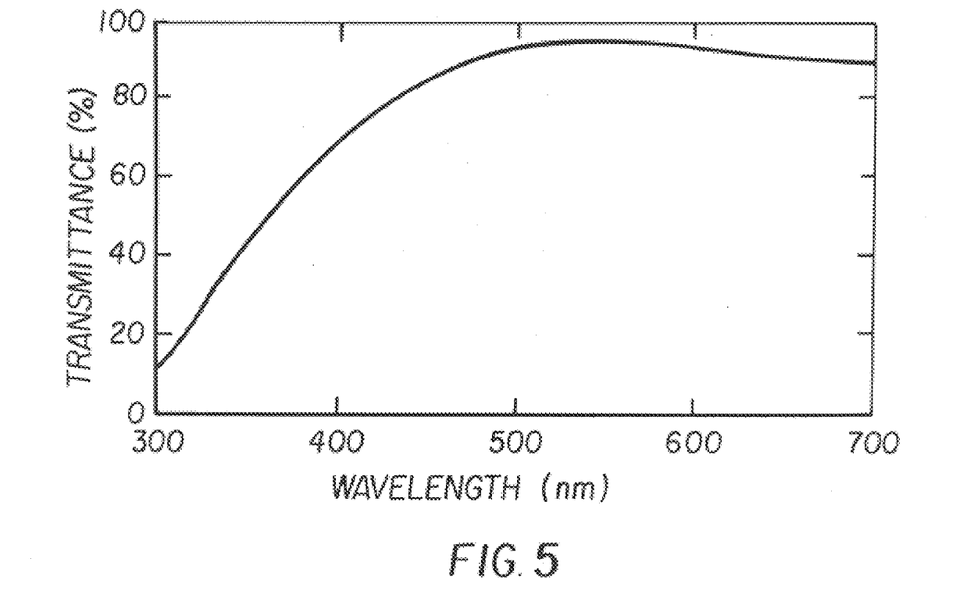
FIG. 5 is a graph showing a spectrum of the transmittance of the amorphous conductive thin film of Example 1 of the present invention.

FIG. 5 is a graph showing a spectrum of the transmittance of the amorphous transparent conductive thin film according to the present invention. It will be understood from FIG. 5 that the transmittance of this transparent conductive thin film is at least 80% in a range of visible light (450 nm–650 nm). The resistivity of this transparent conductive thin film was $5.0 \times 10^{-4}$ Ω·cm. Thus, the transmittance and resistivity of this transparent conductive thin film make the resulting conductor suitable for practical use.

EXAMPLE 2

This example was produced in the same manner as in Example 1 except that ITO used for forming the second conductor was replaced by indium zinc oxide. On each of the first conductors prepared as described above in Example 1, a transparent conductive thin film having a thickness of 150 nm was formed by reactive DC sputtering, using $In_2O_3$-10.7 wt % ZnO target, without heating the substrate.

Figure 6:
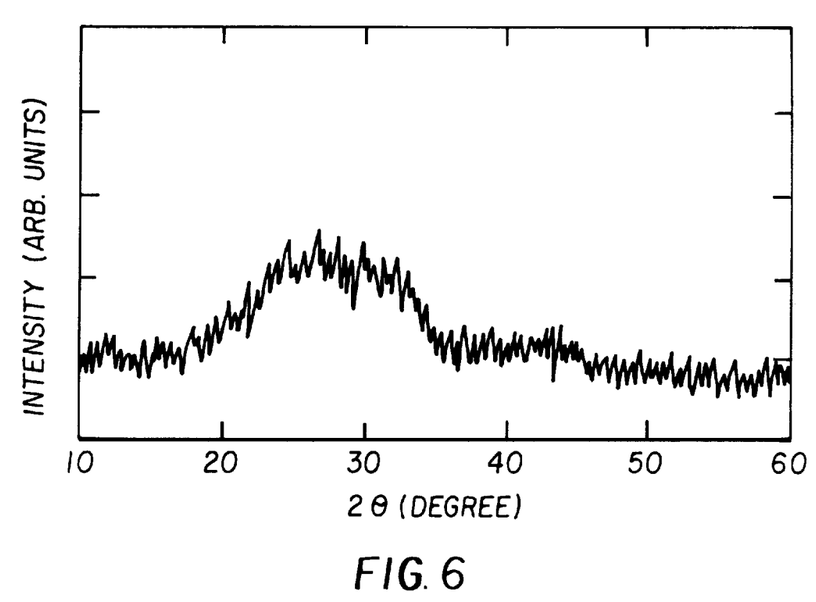
FIG. 6 is a graph showing an X-ray diffraction spectrum of a transparent conductive thin film made of indium zinc oxide in Example 2 of the present invention.

FIG. 6 is a graph showing an X-ray diffraction spectrum of the transparent conductive thin film formed of indium zinc oxide according to the present invention. The X-ray diffraction spectrum indicates a wide peak, which confirms that the obtained transparent conductive thin film is a mono-phase amorphous film.

In each specimen of thin-film laminate type conductor produced as described above, hillocks were not observed in the laminated portion of the first conductor and second conductor.

Figure 7:
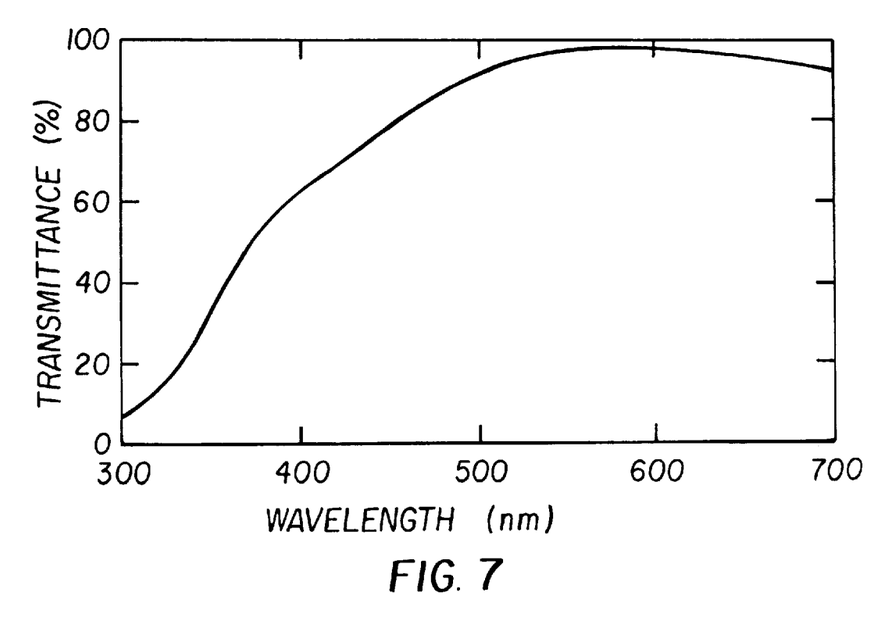
FIG. 7 is a graph showing a spectrum of the transmittance of the transparent conductive thin film made of indium zinc oxide in Example 2.

FIG. 7 is a graph showing a spectrum of the transmittance of the transparent conductive thin film made of indium zinc oxide according to the present invention. It will be understood from FIG. 7 that the transmittance of this transparent conductive thin film is 80% or greater in a range of visible light (450 nm–650 nm). The resistivity of this transparent conductive thin film was $5.0 \times 10^{-4}$ Ω·cm. Thus, the transmittance and resistivity of this transparent conductive thin film make the resulting conductor suitable for practical use.

In Example 3 through Example 8, the first conductor consists of two metal thin films, and the second conductor consists of a crystalline transparent conductive thin film.

EXAMPLE 3

An Al thin film having a thickness of 70 nm was formed by DC sputtering on a glass substrate (NA-45 manufactured by HOYA Corporation), and an Mo film having a thickness of 30 nm was formed on the Al thin film, to provide a double-layer metal thin film. After this double-layer metal film was coated with a resist, and the resist was patterned in a suitable shape, the substrate with the double-layer metal film was immersed in an etching liquid containing phosphoric acid and nitric acid and heated to 30° C., so that the Al film and Mo film were patterned at the same time to provide the first conductor.

Then, the substrate was heated to 300° C., and a transparent conductive thin film having a thickness of 150 nm was formed by reactive DC sputtering, using $In_2O_3$-10 wt % $SnO_2$ target, and then patterned to provide the second conductor (as shown in FIG. 2).

Figure 8:
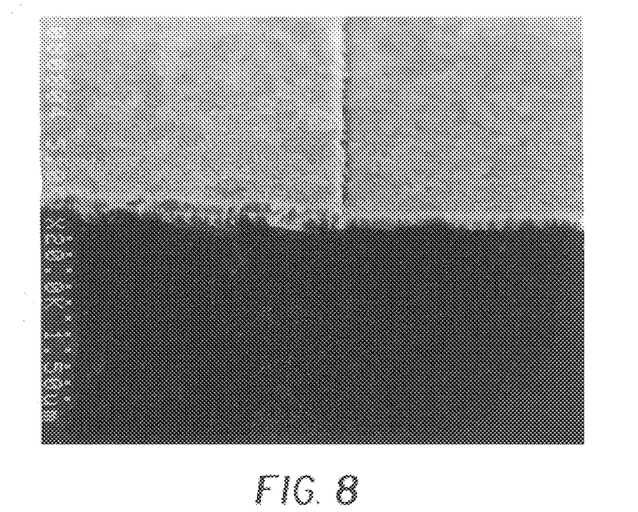
FIG. 8 is a SEM photograph showing the surface condition of the thin-film laminate type conductor of the present invention having the first conductor consisting of laminated metal thin films.

FIG. 8 is a SEM photograph showing the surface condition of the thin-film type conductor wherein the metal thin film consists of laminated films. It will be understood from FIG. 8 that hillocks are not observed in the laminated portion (on the left-hand side of the vertical boundary) of the transparent conductive thin film and metal thin film.

The transmittance of this transparent conductive thin film was 90% or greater in a range of visible light (450 nm–650 nm), and the resistivity of this film was $1.7 \times 10^{-4}$ Ω·cm. Thus, the transparent conductive thin film shows desirable characteristics.

EXAMPLE 4

This example was produced in the same manner as in Example 3 except that ITO for forming the second conductor was replaced by indium zinc oxide.

After forming the first conductor in the same manner as in Example 3, the substrate was heated to 200° C., and a transparent conductive thin film having a thickness of 150 nm was formed on the first conductor by reactive DC sputtering, using $In_2O_3$-10.7 wt % ZnO target, and then patterned, to thus form the second conductor.

As in Example 3, hillocks were not observed in the laminated portion of the transparent conductive thin film and metal thin film.

The transmittance of this transparent conductive thin film was 90% or greater in a range of visible light (450 nm–650 nm), and the resistivity of this film was $2.3 \times 10^{-4}$ Ω·cm.

EXAMPLE 5

An Al film having a thickness of 70 nm and a Ta film having a thickness of 30 nm were successively formed by DC sputtering on a glass substrate (NA-45, manufactured by HOYA Corporation) to provide a laminated film. After this laminated film was coated with a resist, and the resist was patterned in a suitable shape, the substrate with the laminated film was immersed in an etching liquid containing potassium hydride as a major component and heated to 30° C., so that the Al film and Ta film were patterned at the same time to provide a first conductor.

In a similar manner, Ti, Cr and Ni were respectively laminated on Al films formed on different substrates, and the laminated films were patterned in a suitable shape, to provide additional first conductors.

Thereafter, the substrate was heated to 300° C., and a crystalline transparent conductive thin film having a thickness of 150 nm was formed on each of the first conductors by reactive DC sputtering, using a $In_2O_3$-10 wt % $SnO_2$ target.

With respect to each specimen thus obtained, hillocks were not observed at the surface of the transparent conductive thin film.

EXAMPLE 6

This example was produced in the same manner as in Example 5 except that ITO used for forming the second conductor was replaced by indium zinc oxide.

After forming the first conductors having different compositions in the manner as in Example 5, the substrate was heated to 200° C., and a transparent conductive thin film having a thickness of 150 nm was formed on each of the first conductors by reactive DC sputtering, using $In_2O_3$-10.7 wt % ZnO target, and then patterned, to thus form the second conductor.

With respect to each specimen thus obtained, hillocks were not observed at the surface of the transparent conductive thin film.

EXAMPLE 7

Initially, a metal thin film having a thickness of 70 nm and made of Al-2 at % Si was formed by DC sputtering on a glass substrate (NA45, manufactured by HOYA Corporation), to provide a first metal thin film. In a similar manner, 70 nm-thickness films made of Al-2 at % Cu, Al-1 at % Ta, Al-1 at % Ti, Al-1 at % Mo, Al-2 at % Y and Al-2 at % Nd were respectively formed on different substrates, to further provide first metal thin films. Then, a second metal thin film made of Mo and having a thickness of 30 nm was formed on each of these first metal thin films, to thus provide a double-layer film. After the double-layer film was coated with a resist, and the resist was patterned in a suitable shape, the substrate with the double-layer film was immersed in an etching liquid containing phosphorous acid and nitric acid and heated to 30° C., so that the two thin films were patterned at the same time so as to provide a first conductor.

Similarly, second metal thin films made of Ta, Ti, Cr and Ni were respectively laminated on the first metal thin films made of the above-indicated Al alloys, and patterned in a suitable shape, to provide additional first conductors.

Thereafter, the substrate was heated to 300° C., and a crystalline transparent conductive thin film having a thickness of 150 nm was formed on each of the above first conductors by reactive DC sputtering, using $In_2O_3$-10.7 wt % $SnO_2$ target, and then patterned to form a second conductor.

With respect to each specimen thus obtained, hillocks were not observed at the surface of the transparent conductive thin film.

EXAMPLE 8

This example was produced in the same manner as in Example 7 except that ITO used for forming the second conductor was replaced by indium zinc oxide.

After forming the first conductors having different compositions in the manner as in Example 7, the substrate was heated to 200° C., and a transparent conductive thin film having a thickness of 150 nm was formed on each of the first conductors by reactive DC sputtering, using $In_2O_3$-10.7 wt % ZnO target, and then patterned, to thus form a second conductor.

With respect to each specimen thus obtained, hillocks were not observed at the surface of the transparent conductive thin film.

While the glass substrate was used in each of the illustrated examples, the substrate used in the present invention may be formed from a film-like substrate, such as a polymer film, or an organic film, such as a color filter, which is formed on a glass substrate.

According to the present invention, the thin-film laminate type conductor includes the first conductor which is a metal thin film made of Al or an Al alloy, and the second conductor which is a transparent conductive thin film made of a metal oxide. The first and second conductors are formed in respective patterns on a transparent substrate, such that at least a part of the second conductor is laminated on at least a part of the first conductor. The transparent conductive thin film of the second conductor consists of an amorphous film. When this amorphous transparent conductive thin film is formed, the substrate is kept at a temperature that is lower than the temperature at which the transparent conductive material is crystallized. Accordingly, thermal influences on the first conductor are eliminated, and hillocks are prevented from appearing at the surface of the transparent conductive thin film.

According to another aspect of the invention, the first conductor consists of laminated films, namely, a first metal thin film formed of Al or Al alloy, and a second metal thin film formed of a high-melting-point metal. The second metal thin film is laminated on the first metal thin film formed on the substrate, so that the first metal thin film made of Al or Al alloy is sandwiched between such materials that have smaller coefficients of thermal expansion than Al or Al alloy. The thus laminated structure is able to reduce or prevent thermal expansion of the metal thin film due to heat applied to the substrate when the transparent conductive thin film is formed, and therefore hillocks can be prevented from appearing on the transparent conductive thin film.

The above-described thin-film type conductors that are free from hillocks do not cause shortcircuiting with opposed electrodes, and can be thus advantageously used as pixel electrodes or wires in EL displays or liquid crystal displays.

What is claimed is:

1. A thin-film laminate type conductor, comprising:
   a first conductor which is a metal thin film comprising one of Al and an Al alloy, said first conductor being formed in a pattern on a transparent substrate; and
   a second conductor which is a transparent conductive thin film comprising a metal oxide, said second conductor being formed in a pattern on the substrate, such that at least a part of said second conductor is laminated on at least a part of said first conductor,
   wherein said transparent conductive thin film is amorphous.

2. A thin-film laminate type conductor according to claim 1, wherein said Al alloy of said metal thin film is selected from the group consisting of Al alloys containing at least one of Si, Cu, Ti, Ta, Mo, Cr, Ni, Y, La, Nd, Gd, Tb and Dy.

3. A thin-film laminate type conductor according to claim 1, wherein said metal oxide is indium tin oxide.

4. A thin-film laminate type conductor according to claim 1, wherein said metal oxide is indium zinc oxide.

5. A thin-film laminate type conductor, comprising:
   a first conductor which is a metal thin film formed in a pattern on a transparent substrate; and
   a second conductor which is a transparent conductive thin film comprising a metal oxide, said second conductor being formed in a pattern on the substrate such that at least a part of said second conductor is laminated on at least a part of said first conductor, wherein said first conductor comprises a first metal thin film comprising one of Al and an Al alloy, and a second metal thin film comprising a high-melting-point metal, said second metal thin film being laminated on said first metal thin film formed on the substrate.

6. A thin-film laminate type conductor according to claim 5, wherein said transparent conductive thin film is crystalline.

7. A thin-film laminate type conductor according to claim 5, wherein said Al alloy of said first metal thin film of said first conductor is selected from the group consisting of Al alloys containing at least one of Si, Cu, Ti, Ta, Mo, Cr, Ni, Y, La, Nd, Gd, Tb and Dy.

8. A thin-film laminate type conductor according to claim 5, wherein said metal oxide is indium tin oxide.

9. A thin-film laminate type conductor according to claim 5, wherein said metal oxide is indium zinc oxide.

* * * * *

UNITED STATES PATENT AND TRADEMARK OFFICE
CERTIFICATE OF CORRECTION

PATENT NO.   : 6,215,077 B1                                              Page 1 of 1
DATED        : April 10, 2001
INVENTOR(S)  : Makoto Utsumi et al.

It is certified that error appears in the above-identified patent and that said Letters Patent is hereby corrected as shown below:

Claim 7, column 10,
Line 5, please change "Th" to -- Tb --.

Signed and Sealed this

Sixteenth Day of October, 2001

*Attest:*

*Attesting Officer*

NICHOLAS P. GODICI
*Acting Director of the United States Patent and Trademark Office*